United States Patent [19]

Weng

[11] Patent Number: 5,001,715
[45] Date of Patent: Mar. 19, 1991

[54] ERROR LOCATION SYSTEM

[75] Inventor: Lih-Jyh Weng, Lexington, Mass.

[73] Assignee: Digital Equipment Corporation, Maynard, Mass.

[21] Appl. No.: 550,802

[22] Filed: Jul. 9, 1990

Related U.S. Application Data

[63] Continuation of Ser. No. 193,381, May 12, 1988, abandoned.

[51] Int. Cl.$^5$ .............................................. G06F 11/10
[52] U.S. Cl. ................................................. 371/37.1
[56] References Cited

U.S. PATENT DOCUMENTS 4,536,886  8/1985  Papamichalis et al. .......... 364/513.5
4,642,808  2/1987  Baggem ................................ 371/37

OTHER PUBLICATIONS

Berlekamp, *Algebraic Coding Theory*, 1968, McGraw-Hill Inc., pp. 132–135.
Lin et al, *Error Control Coding: Fundamentals and Applications*, 1983, Prentice-Hall Inc., pp. 140–171.
Rao et al, *Error Control Coding for Computer Systems*, 1989, Prentice-Hall Inc., pp. 96–113.

*Primary Examiner*—Jerry Smith
*Assistant Examiner*—David Huntley
*Attorney, Agent, or Firm*—Nutter, McClennen & Fish

[57] ABSTRACT

The invention is an error correcting system which calculates the error locations, that is, finds the roots of the error locator equation:

$$1+\delta_1{}^*x+\delta_2{}^*x^2+\delta_3 x^3+\ldots+\delta_{v-1}{}^*x^{v-1}+\delta_v{}^*x^v=0 \quad (1)$$

where "+" and "*" represent Galois Field addition and Galois Field multiplication, respectively, and "v" is the number of errors in the data by substituting the error location equation coefficients into a succession of v error location formulas along with successive values of x to determine if the various x's are roots of equation (1). When the first root is found, extraction of the root corresponds to reducing the degree of equation (1) by one, to (v−1), and also to reducing the number of error location formulas by one to (v−1). Thus substitution in the error location formulas of further values of x to find the next root requires one fewer addition operation and one fewer multiplication operation. When another root is found, the error location formulas are further reduced by one. This procedure is repeated until, depending on the system utilized, all v roots are found or v is reduced to a value of 2, 3 or 4, and a fast-decoding method is utilized to find the remaining roots.

8 Claims, 6 Drawing Sheets

FIGURE 2B

ERROR LOCATION SYSTEM

This is a continuation of application Ser. No. 193,381 filed May 12, 1988 now abandoned.

FIELD OF INVENTION

This invention relates to error correction code decoding mechanisms in general and more particularly to the decoding of Bose-Chaudhuri-Hocquenghem (BCH) error correction codes, including Reed-Solomon error correction codes.

DESCRIPTION OF PRIOR ART

The importance of error correction coding of data in digital computer systems has increased greatly as the density of the data recorded on mass storage media, more particularly magnetic disks, has increased. With higher recording densities, a tiny imperfection in the recording surface of a disk can corrupt a large amount of data. In order to avoid losing that data, error correction codes ("ECC's") are employed to, as the name implies, correct the erroneous data.

Before a string of data symbols is recorded on a disk, it is mathematically encoded to form ECC symbols. The ECC symbols are then appended to the data string to form code words—data symbols plus ECC symbols-—and the code words are then stored on the disk. When the stored data is to be retrieved from the disk, the code words are mathematically decoded. During decoding any errors in the data are detected and, if possible, corrected through manipulation of the ECC symbols [For a detailed description of decoding see Peterson and Weldon, *Error Correction Codes*, 2d Edition, MIT Press, 1972].

Stored digital data can contain multiple errors. One of the most effective types of ECC used for the correction of multiple errors is a Reed-Solomon code [For a detailed description of Reed-Solomon codes, see Peterson and Weldon, Error Correction Codes]. Error detection and correction techniques for Reed-Solomon ECC's are well known. Id. One such technique begins with again encoding the data string in the retrieved code word to generate ECC symbols and then comparing these ECC symbols with the ECC symbols in the retrieved code word, i.e. the ECC symbols generated by the pre-storage encoding of the data, to detect any errors in the retrieved code word data. [For a detailed discussion of this error detection technique, see U.S. Pat. No. 4,413,339 issued to Riggle and Weng].

The comparison of the two sets of ECC symbols is made by exclusive OR'ing ("XOR'ing") them. If there are no errors in the retrieved code word data, the XOR'ing will produce a string of symbols containing only zeros. If there are errors in the retrieved data, the result of the XOR'ing will be non-zero and error correction will be performed, if possible. If the number of non-zero symbols which result from the XOR'ing is less than the number of errors the code is designed to correct, all the errors are in the ECC symbols, i.e. there are no errors in the data string, and no error correction is required. If the number of non-zero resulting symbols is equal to or greater than the number of errors the code is designed to correct, the retrieved data string contains one or more errors and error correction is then performed.

In order to correct the data errors, the locations and the magnitudes or "values" of the errors must be determined. The first step in determining the error locations and the error values is to form error syndrome equations from the results of the XOR'ing of the ECC symbols. [For a detailed discussion of the generation of the error syndromes refer to U.S. Pat. No. 4,413,339 issued to Riggle and Weng]. The error syndromes are then used to generate polynomials which, when evaluated, will identify the location and the value of each of the errors. Alternatively the error syndromes may be formed by using the entire retrieved code word. This will avoid the steps of re-encoding the retrieved data and comparing the ECC symbols with the retrieved ECC symbols. However, error syndromes must then be generated for every code word, even those without errors, although in the latter case the syndromes will be identically zero. Where there are errors, i.e. the error syndromes are not zero, the syndromes are then used to locate and correct any errors in exactly the same manner as the syndromes formed from the results of the XOR'ing of the ECC symbols. The choice between these two arrangements may, for example, depend on whether the syndromes are generated in software or hardware.

The calculation of the values of the errors is necessarily dependent on their locations. The error locations are calculated by using the error syndromes to generate an error locator polynomial $\delta(x)$ of degree v, where v is the number of errors. The solutions or roots of the equation $\delta(x)=0$ designate the locations of the errors. These roots are of the form $x_i = \alpha^i$, where $\alpha$ is the primitive element of the Galois Field $GF(p^q)$ used to encode the data.

The roots of the error locator equation are typically found using a Chien search. The Chien search systematically tries each element x of $GF(p^q)$ as a possible solution to $\delta(x)=0$. Each time a new value of x is tried, v Galois Field multiplication operations and v Galois Field addition operations are performed to determine if x is a solution. Once all v roots have been found, they are substituted into an error evaluator polynomial $\Phi(x)$ and the corresponding error magnitudes, or values are calculated. The data can then be corrected by multiplying the erroneous data symbol by a correction symbol to produce an error-free data symbol.

The time it takes to perform error correction significantly affects the rate at which data can be retrieved from a storage device. As the potential for errors in stored data increases with the use of higher recording densities, slow error correction has a material effect on the average speed with which the data can be retrieved. The increased data retrieval time in turn limits the speed of all computer applications that require the retrieval of stored data. This speed limitation occurs at a time when computer system technology advances have otherwise made possible faster data transfer operations.

Thus there is a need for an error correction technique that can be performed more quickly than the methods currently in use. Such a technique will enable computer systems to operate at the faster rates permitted by the advances in the state of the art computer technology.

SUMMARY OF THE INVENTION

The invention is an error correcting system which calculates the error locations with a reduced number of operations. The error correcting system can thus more quickly correct the errors. Basically, each time a root of the error locator equation is found, the equation is modified to reduce the number of Galois Field multiplication and addition operations that are required to evaluate as possible solutions the remaining values of x. The modification, in effect, reduces the degree of the equation. All of the roots of the equation may be found using this technique, or the technique may be used to find several of the roots and a fast-decode method designed specifically for solving equations having two, three or four roots may be used to find the remaining roots.

In brief summary the error locator equation is:

$$1+\delta_1{}^*x+\delta_2{}^*x^2+\delta_3x^3+\ldots+\delta_{v-1}{}^*x^{v-1}+\delta_v{}^*x^v=0 \quad (1)$$

where "+" and "*" represent Galois Field addition and Galois Field multiplication, respectively, and "v" is the number of errors in the data. As described below, the coefficients of equation (1) are substituted into a succession of v error location formulas along with successive values of x, to determine if the various x's are roots of equation (1). Since equation (1) is of degree v, each such determination requires v multiplication and v addition operations. When the first root is found, extraction of the root corresponds to reducing the degree of equation (1) by one, to (v − 1), and also to reducing the number of error location formulas by one to (v − 1). Thus substitution in the error location formulas of further values of x to find the next root requires one fewer addition operation and one fewer multiplication operation.

Thereafter, when another root is found, the error location formulas are further reduced by one. This procedure is repeated until, depending on the system utilized, all v roots are found or v is reduced to a value of 2, 3 or 4, and a fast-decoding method is utilized to find the remaining roots.

Reducing the number of multiplication and addition operations required to find the remaining roots of the error locator equation each time a root is found speeds-up the error correction process. The faster errors in the data can be corrected, the faster the data can be transmitted to the remainder of the data processing system. This is particularly important as data is recorded at increased densities, leading to more errors, and thus requiring more error correction.

DESCRIPTION OF THE DRAWINGS

This invention is pointed out with particularity in the appended claims. The above and further advantages of this invention may be better understood by referring to the following description taken in conjunction with the accompanying drawings, in which:

DETAILED DESCRIPTION

It should be understood that all addition and multiplication operations performed by the inventive system are Galois Field operations and that the Galois Fields are of the form $GF(p^q)$.

Conventional techniques are used to generate the error syndromes from the data and then to generate the error locator equation, $\delta(x)=0$.

Figure 1:
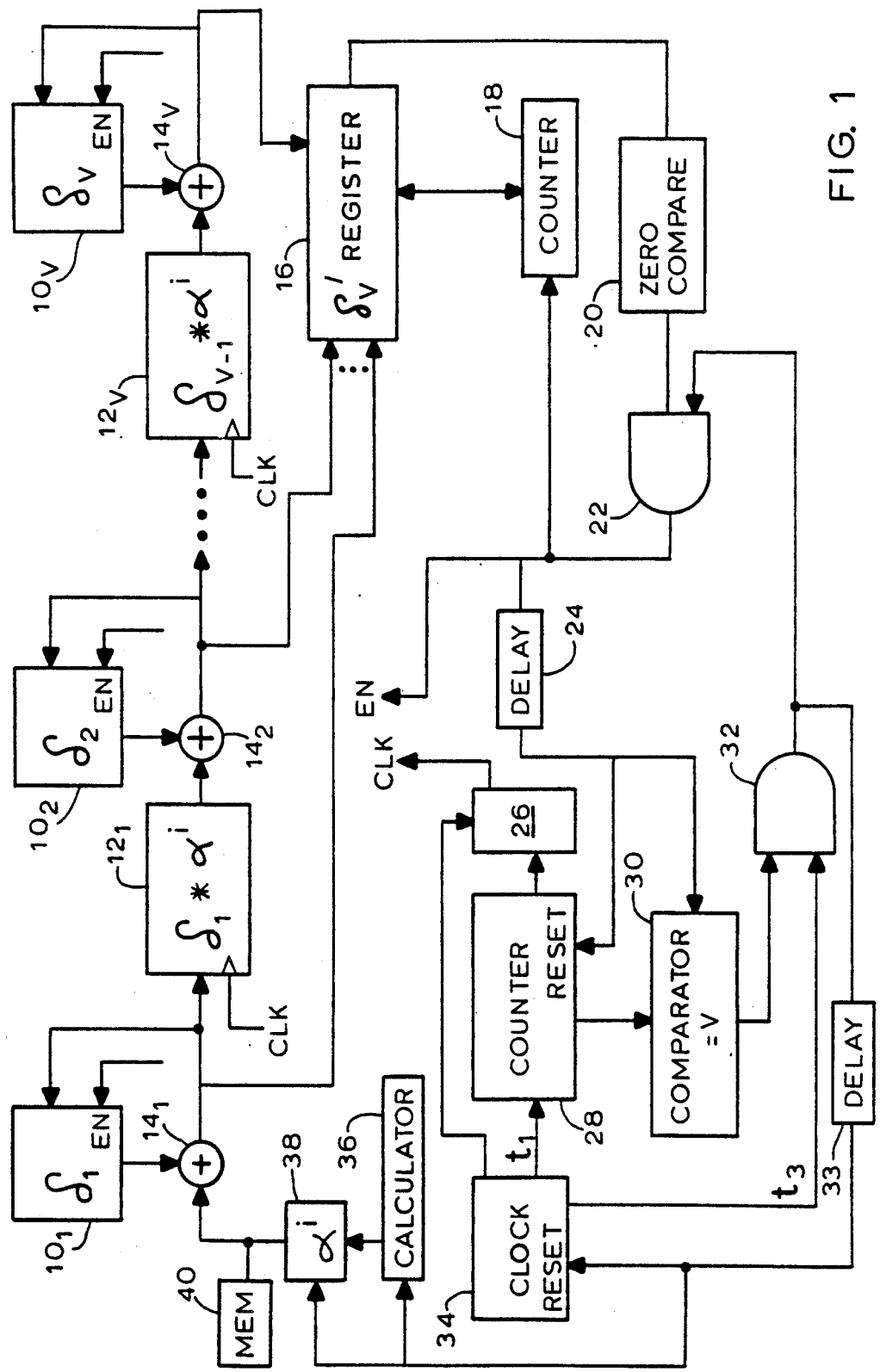
FIG. 1 is a functional block diagram of a decoding system built in accordance with a first embodiment of the invention.
Figure 2A:
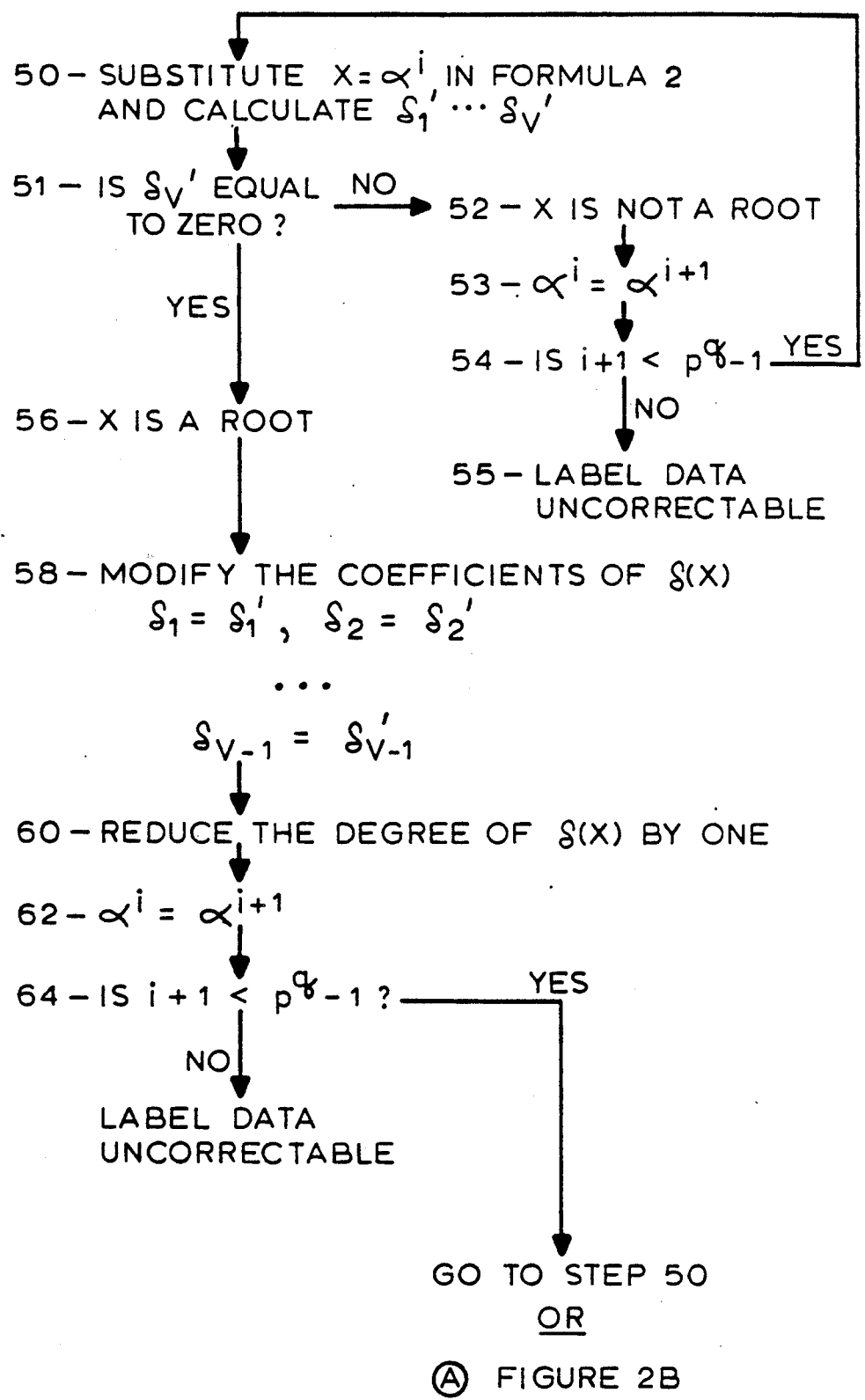
FIGS. 2A-B are flow charts of the steps involved in the operation of the first embodiment of the invention.
Figure 2B:
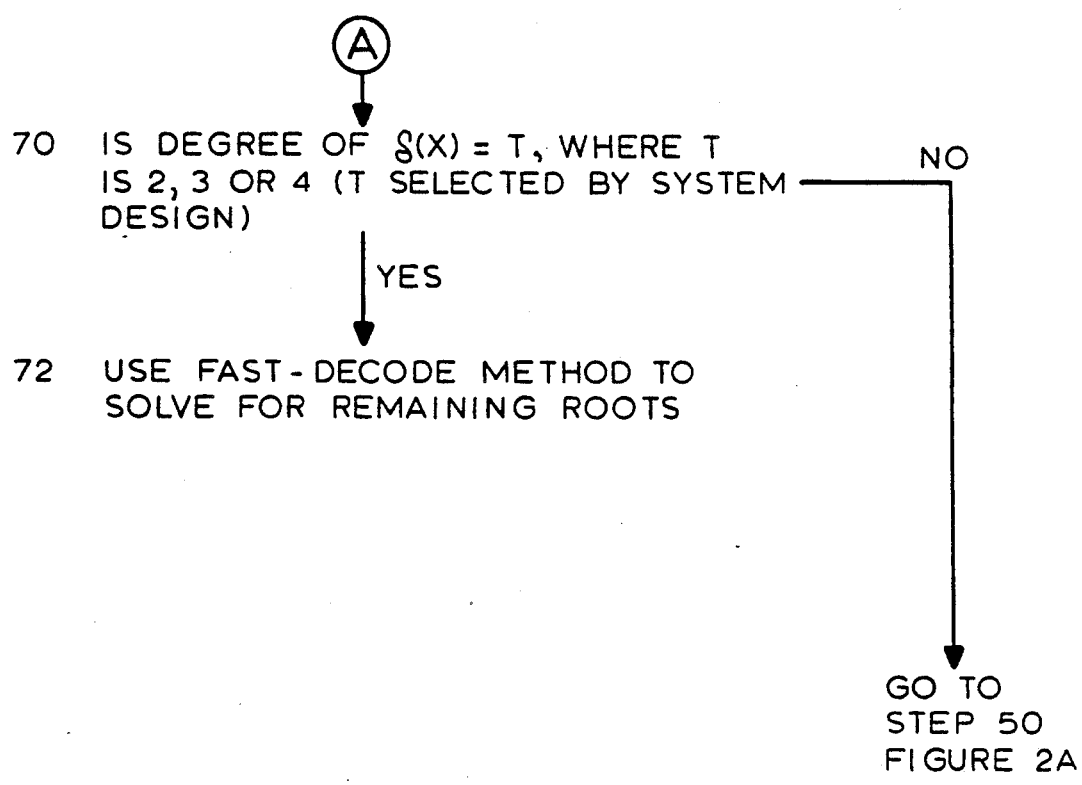

With reference to FIGS. 1 and 2, an error correcting system 8 evaluates $\delta(x)$ at various values of x using the following set of error location formulas:

$$\delta_1' = \delta_1 + \alpha^i \quad (2_1)$$
$$\delta_2' = \delta_1' * \alpha^i + \delta_2 \quad (2_2)$$
$$\cdot$$
$$\cdot$$
$$\delta_v' = \delta_{v-1}' * \alpha^i + \delta_v \quad (2_v)$$

where $\delta^i = x$ and the terms $\delta_j'$ are modifications of the $\delta_j$ terms, not derivatives of these terms (step 50). Successive values of $\delta_j'$ are calculated from the previous values until the value of $\delta_v'$ is determined. If $\delta_v'$ is equal to ZERO for a particular x, x is a root of equation (1) (steps 51, 56).

Formulas $2_1-2_v$ are evaluated using registers $10_1-10_v$ (generally referred to by the numeral 10), Galois Field multipliers $12_1-12_v$ (generally referred to by the numeral 12) and Galois Field adders $14_1-14_v$ (generally referred to by the numeral 14). To begin, the coefficients of equation (1) are stored in registers 10, a counter 18 and a comparator 30 are initialized to v, and an $\alpha$ register 38 is initialized to a first value of x, $x=\alpha^i$ where i is typically zero.

Register 38 applies the first x value to each of the multipliers 10 and to the adder $14_1$. The adder $14_1$ calculates the sum:

$$\delta_1' = \delta_1 + \alpha^i.$$

This sum is applied to both to a register 16 where it is stored and to a multiplier $12_1$ which, when clocked by a clock 34 through gates 26 as discussed in more detail below, calculates the product:

$$\delta_1' * \alpha^i$$

This product is applied to adder $14_2$, which calculates the sum, $\delta_2'$. The value of $\delta_2'$ is stored in a register 16, and it is also used to calculate the product $\delta_2' * \alpha^i$. This product is then used to calculate $\delta_3'$ and the value of $\delta_3'$ is stored in register 16. The sums $\delta_j'$ and the products $\delta_j' * \alpha^i$ are similarly calculated for each coefficient using the multipliers 12 and the adders 14, and the each of the values of $\delta_j'$ are in turn stored in the register 16.

Register 16 is addressed by counter 18, which is set to the value v. Thus the register 16 applies the contents of the storage location addressed by the counter to its output. Accordingly, when the term $\delta_v'$ is applied to the register 16, it appears also at its output. This output is then applied to a zero compare 20 where it is compared to ZERO. If $\delta_v'$ equals ZERO, indicating that $\alpha^i$ is a root of the error location equation, the output of the zero compare 20 is asserted. If $\delta_v'$ does not equal ZERO, indicating $\alpha^i$ is not a root of the error locator equation, the output of the zero compare 20 is not asserted.

Clock 34 controls the timing of the various multipliers and gates using three timers, namely $t_1$, $t_2$, and $t_3$, to avoid race conditions. Timer $t_1$ clocks counter 28 which, in effect, counts the number of multiplication operations performed in calculating $\delta_v'$. Timer $t_2$, which is slightly slower than $t_1$, clocks gates 26 which in turn clock multipliers 12. Timer $t_3$, which is slightly slower than timer $t_2$, acts as an input to an AND gate 32.

To begin calculating the formulas $2_1-2_\nu$, the sum $\delta_1'$ is calculated by adder $14_1$ as described above and the sum is applied to multiplier $12_1$. Timer $t_1$ clocks counter 28, and the counter applies a count of one, signalling the first of $\nu$ multiplication operations, to the gates 26. Thereafter the gates 26, when clocked by timer $t_2$, apply a clock pulse to the first multiplier $12_1$ and the first product, $\delta_1'*\alpha^i$, is calculated. The output of counter 28 is also applied to the comparator 30, where it is compared to $\nu$. The comparator 30 asserts its output when the count equals $\nu$, indicating the occurrence of the "$\nu$th" multiplication operation. If the count of counter 28 is not equal to $\nu$, the output of the comparator 30 remains de-asserted.

Assuming that the count does not equal $\nu$, the first product calculated by multiplier 12 is applied to adder $14_2$ which adds it to $\delta_2$ to produce the sum $\delta_2'$. This sum is stored in the register 16 and is also applied to multiplier $12_2$. Timer $t_1$ clocks the counter 28, which increases the count to two, indicating that the second multiplication is to occur. The output of counter 28 is applied to gates 26 which, when subsequently clocked by timer $t_2$, clock multiplier $12_2$ which then calculates the product:

$$\delta_2'*\alpha^i.$$

This product is applied to adder $14_3$ which calculates the sum $\delta_3'$, and the sum is again stored in register 16. The same series of addition and multiplication operations continue and the sums $\delta_j'$ are stored in the register 16 until the count of counter 28 equals $\nu$, indicating the start of the calculation of formula ($2_\nu$). When the count of counter 28 equals $\nu$, the output of the comparator 30, which is comparing the count to $\nu$, is asserted. The output is applied to one input of an AND gate 32, which has a second input connected to timer $t_3$. Thus when timer $t_3$ is pulsed, the output of the AND gate 32 is asserted.

The output is applied to one input of AND gate 22, which has a second input connected to the output of zero compare 20. If the sum $\delta_\nu'$ is equal to ZERO, that is, x is a root, the output of AND gate 22 will then be asserted. Otherwise, if $\delta_\nu'$ is not equal to ZERO, the output of the zero compare 20 remains de-asserted and thus the output of AND gate 22 is not asserted.

If x is not a root of equation (1), a new value of x is substituted into formulas $2_1-2_\nu$ and the sum $\delta_\nu'$ is calculated and compared to ZERO to determine if it is a root (steps 52-54). Thus the asserted output of AND gate 32 is applied, through delay 33, to (i) reset the clock 34, (ii) load a new value of $x=\alpha^{i+1}$ from calculator 36 into register 38, and (iii) enable calculator 36 to calculate a new value of x. The value of x loaded into register 38 is then evaluated as a possible root, in the manner described above. This evaluation involves $\nu$ multiplication operations and $\nu$ addition operations.

Figure 3:
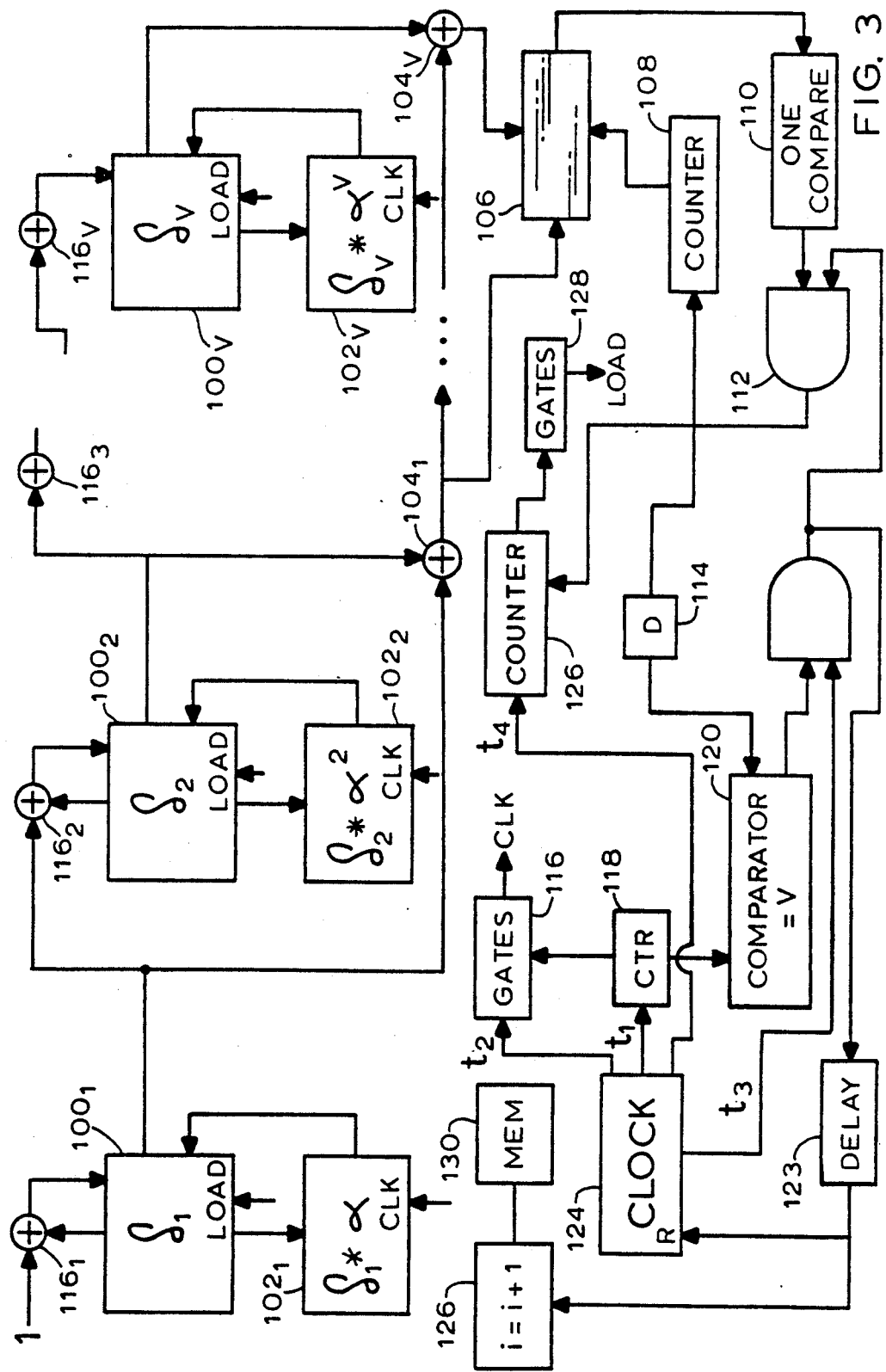
FIG. 3 is a functional block diagram of a decoding system built in accordance with a second embodiment of the invention.

If x is a root, the coefficients of equation (1), and accordingly the formulas $2_1-2_\nu$, are modified and the degree of equation (1), that is, the value of $\nu$, is reduced by one (steps 58-60). Thereafter, a new value of x is substituted into the modified formulas $2_1-2_\nu$ and a new sum $\delta_\nu'$ is calculated (steps 62-64). With further reference to FIG. 3, if x is a root the sum $\delta_\nu'$ is equal to ZERO and the output of the zero compare 20 is asserted. This output is applied to one input of AND gate 22. The second input of AND gate 22 is connected to the output of AND gate 32 which is asserted at the next $t_3$ clock pulse. Thus, two gate delays after $t_3$ is pulsed, the output of AND gate 22 is asserted.

The asserted output of AND gate 22 is applied simultaneously to (i) a memory 40, which stores the value $\alpha^i$ as a root; (ii) the counter 18, which decrements its count to $\nu-1$; and (iii) the registers 10, which load the sums $\delta_j'$. The output of gate 22 is also applied a short time later, through delay 24, to the comparator 30, which decrements the value of $\nu$ stored therein by one. Thereafter, clock 34 is reset through delay 33 and a new value of $x=\alpha^{i+1}$ is loaded into the $\alpha$ register 38. The calculator 36 is also enabled to begin calculating a new value of $x=\alpha^{i+1}$.

When timer $t_1$ is pulsed, the evaluation operations begin, using the modified coefficients, $\delta_j'$, and the new value of x. The evaluation involves one less multiplication operation and one less addition operation. Thus the time required for the evaluation is reduced from the time taken to evaluate the previous value of x as a root.

Each value of $x=\alpha^{i+1}$ calculated by calculator 36 is checked against the code block length, not exceeding $P^1-1$, to determine if the value is a "new" value of x (steps 54,64). If $i+1$ is less than or equal to the code block length, the value of $x=\alpha^{i+1}$ is a new value. If, however, $i+1$ is greater than the code length, the calculated value of $x=\alpha^{i+1}$ corresponds to an error location outside of the code length. If the value of x calculated by calculator 36 is not a "new" x value, it indicates that all the roots of equation (1) can not be found and thus the error locations can not all be determined to be within the code length. Thus calculator 38 notifies a system controller (not shown) that the data is uncorrectable (steps 55, 65).

All the roots of equation 1 which are of the form $x=\alpha^i$ can be found using the technique described above. However, known methods of finding the roots of degree 2, 3 or 4 equations in $FG(p^q)$ may be used to find the remaining roots (steps 70-71, FIG. 2B). The particular method used will depend on system design.

Figure 4A:
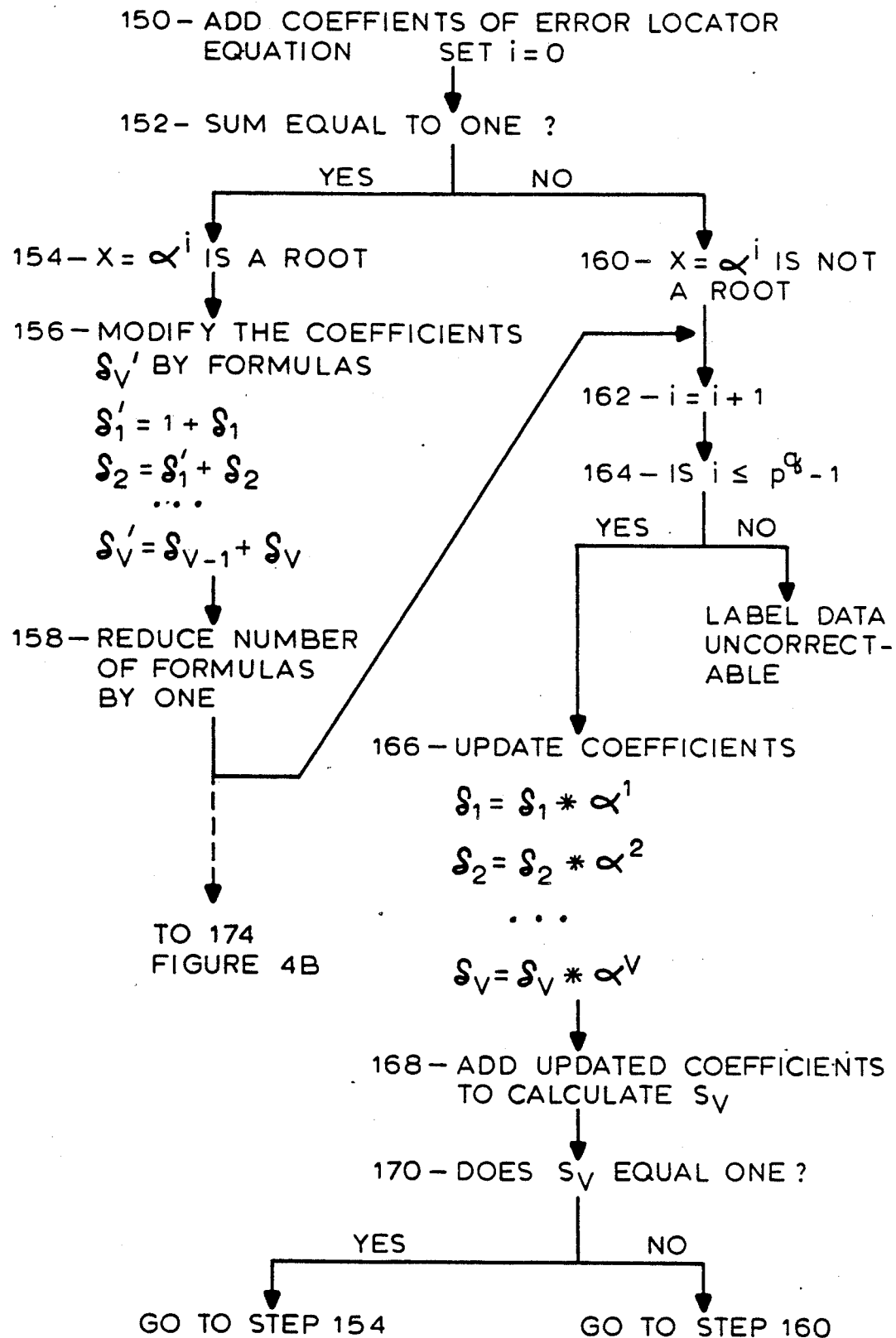
FIGS. 4A-B are flow charts of the steps involved in the operation of a second embodiment of the invention.
Figure 4B:
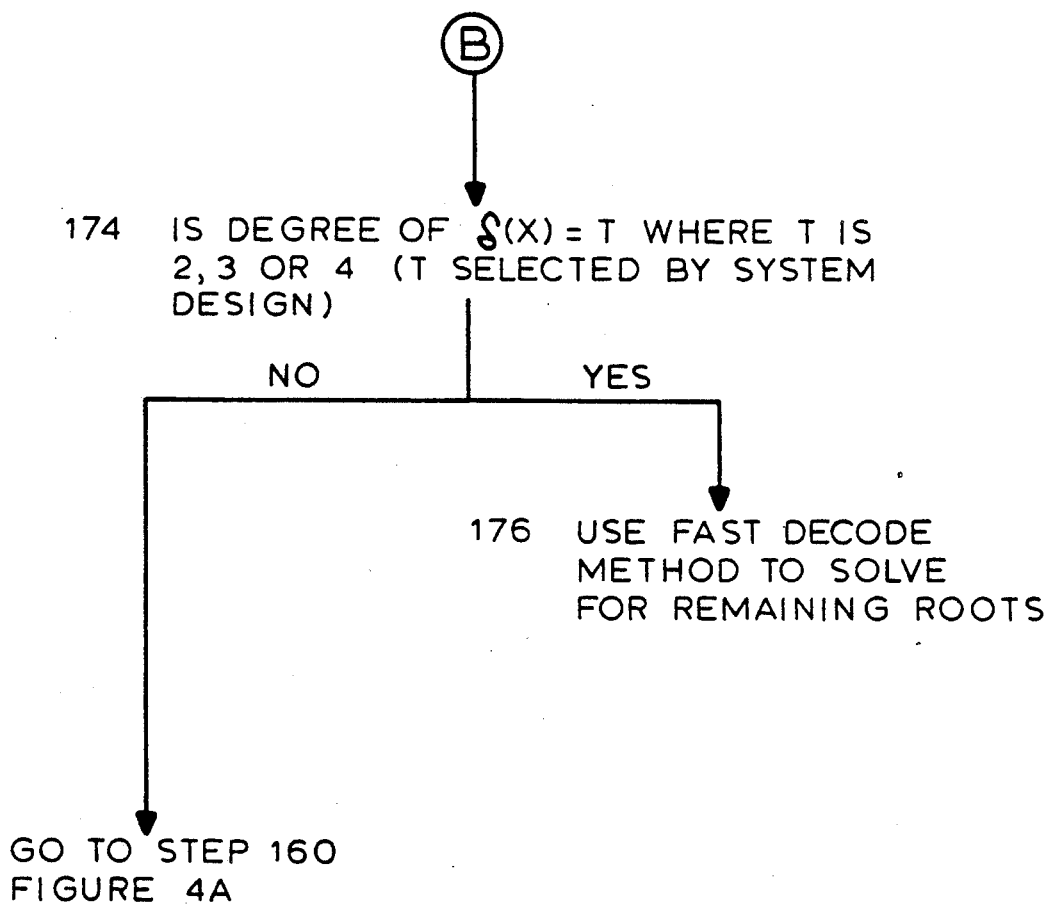

A second embodiment uses a direct modification of the Chien search to find the roots of the error locator equation. With respect to FIGS. 3 and 4, an error correcting system 99 iteratively evaluates $\delta(x)$ by first adding the coefficients of equation (1) to produce the sum $S_\nu$ and comparing the sum to ONE (step 150-152). Thereafter $\delta(x)$ is evaluated using the following set of iterative error location formulas:

$$\delta_1 = \delta_1 * \alpha \qquad (3_1)$$
$$\delta_2 = \delta_2 * \alpha^2 \qquad (3_2)$$
$$\vdots$$
$$\delta_\nu = \delta_\nu * \alpha^\nu \qquad (3_\nu)$$

(step 166). Thus new values of $\delta_j$ are calculated each iteration and after i iterations the formulas have calculated $\delta_k=\delta_{k(original)}*(\alpha^k)^i$. After each iteration the $\delta_j$ terms are added to produce the sum $S_\nu$ (step 168). If $S_\nu$ is equal to ONE for a particular iteration, for example the $i^{th}$ iteration, $x=\alpha^i$ is a root (step 171).

Formulas $3_1-3_\nu$ are evaluated using registers $100_1-100_\nu$ (generally referred to by the numeral 100), Galois Field multipliers $102_1-102_\nu$ (generally referred to by the numeral 102) and Galois Field adders $104_1-104_\nu$ (generally referred to by the numeral 104). To begin, the coefficients of equation (1) are stored in registers 100, a counter 108 and a comparator 120 are each initialized to v, and a register 126 is initialized to a first value of i=0.

The multipliers, counters and timers are clocked by a clock 124, which operates in the same manner as the clock 34 described above with reference to FIG. 1. Each intermediate sum, $S_j$, calculated in adders 104 is applied to a register 106 which is addressed by counter 108. When the sum $S_v$ is applied to the register 106, it appears at the output, also. The sum $S_v$ is then compared to ONE in a one compare 110. If the sum $S_v$ equals ONE, $x=\alpha^i$ is a root of equation (1). If the sum $S_v$ does not equal ONE, $x=\alpha^i$ is not a root.

If x is not a root of equation (1), formulas $3_1-3_v$ are iteratively updated and the sum $S_v$ is calculated (steps 166-168). The sum is then compared to ONE to determine if the x corresponding to the particular iteration is a root (step 170). Accordingly, system 99 operates in a manner similar to the system described with reference to FIG. 1. Thus the clock 124 is reset and the formulas are iteratively updated, corresponding to the earlier-described system trying a new value of x. The new sum Sv is then evaluated to determine if x is a root. This evaluation involves v multiplication operations and v addition operations.

If x is a root, the coefficients of formulas $3_1-3_v$ are modified and the degree of the equation, that is, the value of v, is reduced by one (steps 156-158). This reduces the number of multiplication and addition operations required to evaluate the formula for the next iteration. The coefficients $\delta_j$ are modified as follows:

$$\delta_1' = 1 + \delta_1$$
$$\delta_2' = \delta_1' + \delta_2$$
$$\vdots$$
$$\delta_v' = \delta_{v-1}' + \delta_v$$

where the terms $\delta_j'$ are modifications of the $\delta_j$ terms, not derivatives of these terms (step 156). The modified coefficients are then substituted into formulas $3_1-3_v$ and the formulas are evaluated for an associated next value of x.

With further reference to FIG. 3, if the sum $S_v$ is equal to ONE if $x=\alpha^i$ is a root and the output of the one compare 110 is asserted. Thus the output of AND gate 112 is asserted two gate delays after the output of AND gate 122 is asserted at the next $t_3$ clock pulse. The asserted output of AND gate 112, which signifies that $x=\alpha^i$ is a root of equation (1), is applied simultaneously to (i) a memory 130, which stores the value $\alpha^i$ as a root; (ii) the counter 108, which decrements its count to v−1; and (iii) a counter 126, which, through gates 128, enables successive registers 100 to load the associated sums $\delta_j$. The output of gate 112 is also applied a short time later, through delay 123, to the comparator 120, which decrements the value of v stored therein by one.

Thereafter, clock 124 is reset through delay 123, and the evaluation operations begin, using the modified coefficients, when timer $t_1$ is pulsed. The evaluation involves one less multiplication operation and one less addition operation. Thus the time required for the evaluation is reduced from the time taken to evaluate the iteration corresponding to the previous value of x.

The value of i in register 26, which is updated for each iteration is continuously checked against the code block length, $P^q-1$, to determine if the value is a "new" value of x (step 164) in the same manner as calculator 36 described with reference to FIG. 1. If x is a new value, an $i^{th}$ iteration will be performed. If x is not a "new" value, it indicates that all the roots of equation (1) can not be found in GF($p^q$) and thus the error locations can not all be determined. The system controller is thus notified that the data is uncorrectable (step 165).

All the roots of equation 1 of the form $x=\alpha^i$ can be found using the technique described above. However, known methods of finding the roots of degree 2, 3 or 4 equations in GF($p^q$) may be used to find the remaining roots (step). The particular method used will depend on system design.

The foregoing description has been limited to two specific embodiments of this invention. It will be apparent, however, that variations and modifications may be made to the invention, with the attainment of some or all of the advantages of the invention. Therefore, it is the object of the appended claims to cover all such variations and modifications as come within the true spirit and scope of the invention.

What is claimed as new and desired to be secured by Letters Patent of the United States is:

1. A method of determining the locations of erroneous symbols in a received data code word which is formulated by encoding data symbols in accordance with a BCH code and correcting the errors, said method comprising the steps of:

A. receiving a data code word;
   B. determining if the code word contains errors;
   C. if the code word contains errors, generating an error locator equation relating to the code word, the error locator equation being of the form:

$$1+\delta_1{}^*x+\delta_2{}^*x^2+\delta_3x^3+\ldots+\delta_{v-1}{}^*x^{v-1}+\delta_v{}^*x^v=0$$

where * represents multiplication over a Galois Field used to encode the data symbols and + represents addition over the Galois Field and the roots of the error locator equation correspond to the locations of erroneous code word symbols;

D. determining if $\alpha^i$, where $\alpha^i$ corresponds to the location of a data symbol in the code work, is a root of the error locator equation, and thereby determining that the corresponding data symbol is erroneous, by:
   i. calculating, using the coefficients of the error locator equation, the value of $\delta_v'$ by iteratively calculating $\delta_j'$ j=1 to v according to the formulas:

$$\delta_1' = \delta_1 + \alpha^i$$
   $$\delta_2' = \delta_1'{}^*\alpha^i + \delta_2$$
   $$\vdots$$
   $$\delta_v' = \delta_{v-1}'{}^*\alpha^i + \delta_v$$

ii. comparing $\delta_v'$ to ZERO, and
   iii. storing $\alpha^i$ as corresponding to the location of an erroneous data code word symbol if $\delta_v'$ equals ZERO, which indicates that $\alpha^i$ is a root of the error locator equation;

E1. if $\alpha^i$ is not a root, trying as a root of the error locator equation a next value of $\alpha^1=\alpha^{i+1}$, which corresponds to the next data symbol location, by repeating step D;

E2. if $\alpha^i$ is a root:
   i. dropping the error locator equation term with the largest exponent, thereby reducing the degree of the equation, ii. updating the reduced error locator equation by replacing the coefficients with the $\delta_j'$ values calculated in v step D, iii. selecting a next value of $\alpha^i = \alpha^{i+1}$, which corresponds to the next data symbol location;

F. repeating steps D and E until a predetermined number of error locations have been found, and thus the reduced error locator equation has a predetermined degree;

G. determining the remaining error locations by finding the roots of the reduced error locator equation by using a fast-decode method that finds the roots of an equation of the predetermined degree;

H. correcting the errors in the received code word using the stored $\alpha^i$ values corresponding to the error locations.

2. A method of determining the locations of erroneous symbols in a received data code word which is formulated by encoding data symbols in accordance with a BCH code and correcting the errors, said method comprising the steps of:

A. receiving a data code word;

B. determining if the code word contains errors;

C. if the code word contains errors, generating an error locator equation relating to the code word, the error locator equation being of the form:

$$1 + \delta_1^* x + \delta_2^* x^2 + \delta_3 x^3 + \ldots + \delta_{v-1}^* x^{v-1} + \delta_v^* x^v = 0$$

where * represents multiplication over a Galois Field used to encode the data symbols and + represents addition over the Galois Field and the roots of the error locator equation correspond to the locations of erroneous code word symbols;

D. determining if $\alpha^i$, where $\alpha^i$ corresponds to the location of a data symbol in the code work, is a root of the error locator equation, and thereby determining that the corresponding data symbol is erroneous, by:

i. setting an iteration counter to 0;

ii. adding the coefficients of the error locator equation, and iii. if the sum equals ONE indicating $\alpha^i$ is a root of the error locator equation, storing the value $\alpha^i$, where i equals the count of the iteration counter;

E1. if $\alpha^i$ is a root, updating the error locator equation by:

i. dropping the error locator equation term with the largest exponent, thereby reducing the degree of the equation, and ii. replacing the coefficients of the remaining terms of the error locator equation with $\delta_j'$ values calculated for j = 1 to v − 1, using the formulas:

$$\delta_1' = 1 + \delta_1$$
$$\delta_2' = \delta_1' + \delta_2$$
$$\vdots$$
$$\delta_{v-1}' = \delta_{v-2}' + \delta_{v-1};$$

E2. if $\alpha^i$ is not a root, updating the coefficients of the error locator equation using the formulas:

$$\delta_1 = \delta_1 * \alpha$$
$$\delta_2 = \delta_2 * \alpha^2$$
$$\vdots$$

-continued $$\delta_v = \delta_v * \alpha^v;$$

F. incrementing said counter by one;

G. repeating steps D through F for successive values of $\alpha^i$ until either all the roots of the error locator equation are found or the $\alpha^i$ values corresponding to all possible code word symbol locations have been tried as possible roots; and H1. if all the roots have been found, correcting the errors in the received code word using the stored $\alpha^i$ values corresponding to the error locations; or H2. if the $\alpha^i$ values corresponding to all possible code word symbol locations have been tried as possible roots and all the roots have not been found labeling the data code word uncorrectable.

3. A method of determining the locations of erroneous symbols in a received data code word which is formulated by encoding data symbols in accordance with a BCH code and correcting the errors, said method comprising the steps of:

A. receiving a data code word;

B. determining if the code word contains errors;

C. if the code word contains errors, generating an error locator equation relating to the code word, the error locator equation being of the form:

$$1 + \delta_1^* x + \delta_2^* x^2 + \delta_3 x^3 + \ldots + \delta_{v-1}^* x^{v-1} + \delta_v^* x^v = 0$$

where * represents multiplication over a Galois Field used to encode the data symbols and + represents addition over the Galois Field and the roots of the error locator equation correspond to the locations of erroneous code word symbols;

D. determining if $\alpha^i$, where $\alpha^i$ corresponds to the location of a data symbol in the code word, is a root of the error locator equation, and thereby determining that the corresponding data symbol is erroneous, by:

i. setting an iteration counter to 0;

ii. adding the coefficients of the error locator equation, and iii. if the sum equals ONE indicating $\alpha^i$ is a root of the error locator equation, storing the value $\alpha^i$, where i equals the count of the iteration counter;

E1. if $\alpha^i$ is a root, updating the error locator equation by:

i. dropping the error locator equation term with the largest exponent, thereby reducing the degree of the equation, and ii. replacing the coefficients of the remaining terms of the error locator equation with $\delta_j'$ values calculated for j = 1 to v − 1, using the formulas:

$$\delta_1' = 1 + \delta_1$$
$$\delta_2' = \delta_1' + \delta_2$$
$$\vdots$$
$$\delta_{v-1}' = \delta_{v-2}' + \delta_{v-1};$$

E2. if $\alpha^i$ is not a root, updating the coefficients of the error locator equation using the formulas:

$$\delta_1 = \delta_1 * \alpha$$
$$\delta_2 = \delta_2 * \alpha^2$$
$$\vdots$$

-continued $$\delta_v = \delta_v * \alpha^v;$$

F. incrementing said counter by one;

G. repeating steps D through F for successive values of $\alpha^i$ until either all the roots of the error locator equation are found or the $\alpha^i$ values corresponding to all possible code word symbol locations have been tried as possible roots; and H1. if the $\alpha^i$ values corresponding to all possible code word locations have not been tried:
   i. determining the remaining error locations by using a fast-decode method designed to find the roots of an equation of the predetermined degree, and
   ii. correcting errors in the received code word using the $\alpha^i$ values corresponding to the error locations, H2. if the $\alpha^i$ values corresponding to all possible code word locations have been tried labeling the data code word uncorrectable.

4. A method of determining the locations of erroneous symbols in a received data code word which is formulated by encoding data symbols in accordance with a BCH code and correcting the errors, said method comprising the steps of:

A. receiving a data code word;

B. determining if the code word contains errors;

C. if the code word contains errors, generating an error locator equation relating to the code word, the error locator equation being of the form:

$$1 + \delta_1^* x + \delta_2^* x^2 + \delta_3 x^3 + \ldots + \delta_{v-1}^* x^{v-1} + \delta_v^* x^v = 0$$

where * represents multiplication over a Galois Field used to encode the data symbols and + represents addition over the Galois Field and the roots of the error locator equation correspond to the locations of erroneous code word symbols;

D. determining if $\alpha^i$, where $\alpha^i$ corresponds to the location of a data symbol in the code word, is a root of the error locator equation, and thereby determining that the corresponding data symbol is erroneous, by:
   i. calculating, using the coefficients of the error locator equation, the value of $\delta_v'$ by iteratively calculating $\delta_j'$ j=1 to v according to the formulas:

$$\delta_1' = \delta_1 + \alpha^i$$
$$\delta_2' = \delta_1'^* \alpha^i + \delta_2$$
$$\vdots$$
$$\delta_v' = \delta_{v-1}'^* \alpha^i + \delta_v$$

ii. comparing $\delta_v'$ to ZERO, and
   iii. storing $\alpha^i$ as corresponding to the location of an erroneous data code word symbol if $\delta_v'$ equals ZERO, which indicates that $\alpha^i$ is a root of the error locator equation;

E1. if $\alpha^i$ is not a root, trying as a root of the error locator equation a next value of $\alpha^i = \alpha^{i+1}$, which corresponds to the next data symbol location, by repeating step D;

E2. if $\alpha^i$ is a root:
   i. dropping the error locator equation term with the largest exponent, thereby reducing the degree of the equation,
   ii. updating the reduced error locator equation by replacing the coefficients with the $\delta_j'$ values calculated in v step D,
   iii. selecting a next value of $\alpha^i = \alpha^{i+1}$, which corresponds to the next data symbol location;

F. repeating steps D and E until either all the roots of the error locator equation are found or the $\alpha^i$ values corresponding to all possible code word symbol locations have been tried as possible roots; and G1. if all the roots have been found, correcting the errors in the received code word using the stored $\alpha^i$ values corresponding to the error locations; or G2. if the $\alpha^i$ values corresponding to all possible code word symbol locations have been tried as possible roots and all the roots have not been found labeling the data code word uncorrectable.

5. An apparatus for determining the locations of erroneous symbols in a received data code word which is formulated by encoding data symbols in accordance with a BCH code and correcting the errors, said apparatus including:

A. means for receiving a data code word;

B. determining if the code word contains errors;

C. if the code word contains errors, generating an error locator equation relating to the code word, the error locator equation being of the form:

$$1 + \delta_1^* x + \delta_2^* x^2 + \delta_3 x^3 + \ldots + \delta_{v-1}^* x^{v-1} + \delta_v^* x^v = 0$$

where * represents multiplication over a Galois Field used to encode the data symbols and + represents addition over the Galois Field and the roots of the error locator equation correspond to the locations of erroneous code word symbols;

D. calculating means for calculating for $\alpha^i$, where $\alpha^i$ corresponds to the location of a data code word symbol, using the coefficients of the error locator equation, the value of $\delta_v'$ by iteratively calculating $\delta_j'$ j=1 to v, according to the formulas:

$$\delta_1' = \delta_1 + \alpha^i$$
$$\delta_2' = \delta_1'^* \alpha^i + \delta_2$$
$$\vdots$$
$$\delta_v' = \delta_{v-1}'^* \alpha^i + \delta_v$$

E. means for storing $\alpha^i$ as an indicator of the location of an erroneous symbol if $\delta_v'$ equals ZERO, which indicates that $\alpha^i$ is a root of the error locator equation;

F. updating means, responsive to finding an $\alpha^i$ value which is a root, for updating the error location equation by:
   i. dropping the formula corresponding to the term of the error locator equation with the largest exponent, thereby reducing the degree of the error locator equation, and
   ii. replacing the coefficients with the $\delta_j'$ values calculated by said calculating means; and
   iii. supplying the updated error locator equation to said calculating means;

G. means for supplying to said calculating means a next value of $\alpha^i = \alpha^{i+1}$;

H. said calculating means calculating the value of $\delta_v'$ for the $\alpha^i$ value supplied to it until:

i. a predetermined number of roots are found, which results in the reduction of the degree of the error locator equation to a predetermined degree, the calculating means finding the remaining error locations by using a fast-decode method designed to solve an equation of the predetermined degree, or ii. all the $\alpha hu\ i$ values corresponding to all possible code word symbol locations have been tried, the calculating means labeling the code word uncorrectable if the predetermined number of roots have not been found; and J. means for correcting the errors in the received code word using the $\alpha^i$ values corresponding to the error locations if all the roots of the error locator equation are determined.

6. An apparatus for determining the locations of erroneous symbols in a received data code word which is formulated by encoding data symbols in accordance with a BCH code and correcting the errors, said apparatus including:

A. means for receiving a data code word;

B. means for determining if the code word contains errors;

C. means for generating, for a code word that contains errors, an error locator equation relating to the code word, the error locator equation being of the form:

$$1+\delta_1{}^*x+\delta_2{}^*x^2+\delta_3x^3+\ldots+\delta_{v-1}{}^*x^{v-1}+\delta_v{}^*x^v=0$$

where * represents multiplication over a Galois Field used to encode the data symbols and + represents addition over the Galois Field and the roots of the error locator equation correspond to the locations of erroneous code word symbols;

D. an iteration counter, set to an initial value;

E. an adder for adding the coefficients of the error locator equation;

F. storage means for storing the value $\alpha^i$, where i equals the count of the iteration counter, as an indicator of the location of an erroneous symbol if the coefficient sum equals ONE, which indicates that $\alpha^i$ is a root of the error locator equation;

G. updating means including:

i. cascaded adding means for updating the coefficients of the error locator equation when $\alpha^i$ is a root, that is, when an error location is found, by (1) dropping the error locator equation term with the largest exponent, thereby reducing the degree of the error locator equation, and (2) replacing the remaining coefficients of the equation with $\delta_j{}'$ values calculated for $j=1$ to $v-1$, using the formulas:

$$\delta_1{}' = 1 + \delta_1$$
$$\delta_2{}' = \delta_1{}' + \delta_2$$
$$\vdots$$
$$\delta_{v-1}{}' = \delta_{v-2}{}' + \delta_{v-1},$$

said updating means supplying the updated coefficients to the adder, or ii. multiplication means for updating the coefficients of the error locator equation, if an $\alpha^i$ value is not a root, using the formulas:

$$\delta_1 = \delta_1 * \alpha$$
$$\delta_2 = \delta_2 * \alpha^2$$
$$\vdots$$
$$\delta_v = \delta_v * \alpha^v$$

said updating means supplying the updated coefficients to the adder;

H. means for incrementing said iteration counter each time said updating means supplies updated coefficients to said adder, provided that all the roots have not been found or i does not exceed the code block length of the code used to encode the data;

I. means for correcting the errors in the code word using the stored the $\alpha^i$ values if all the roots are found; and J. means for labeling the code word uncorrectable if all the $\alpha^i$ values corresponding to all possible code word symbol locations have been tried and all the roots have not been found.

7. An apparatus for determining the locations of erroneous symbols in a received data code word which is formulated by encoding data symbols in accordance with a BCH code and correcting the errors, said apparatus including:

A. means for receiving a data code word;

B. means for determining if the code word contains errors;

C. means for generating, for a code word that contains errors, an error locator equation relating to the code word, the error locator equation being of the form:

$$1+\delta_1{}^*x+\delta_2{}^*x^2+\delta_3x^3+\ldots+\delta_{v-1}{}^*x^{v-1}+\delta_v{}^*x^v=0$$

where * represents multiplication over a Galois Field used to encode the data symbols and + represents addition over the Galois Field and the roots of the error locator equation correspond to the locations of erroneous code word symbols;

D. an iteration counter, set to an initial value;

E. an adder for adding the coefficients of the error locator equation;

F. storage means for storing the value $\alpha^i$, where i equals the count of the iteration counter, as indicating the location of an erroneous symbol if the coefficient sum equals ONE;

G. updating means including:

i. cascaded adding means for updating the coefficients of the error locator equation when $\alpha^i$ is a root, that is, when an error location is found, by (1) dropping the error locator equation term with the largest exponent, thereby reducing the degree of the error locator equation, and (2) replacing the remaining coefficients of the equation with $\delta_j{}'$ values calculated for $j=1$ to $v-1$, using the formulas:

$$\delta_1{}' = 1 + \delta_1$$
$$\delta_2{}' = \delta_1{}' + \delta_2$$
$$\vdots$$
$$\delta_{v-1}{}' = \delta_{v-2}{}' + \delta_{v-1},$$

said updating means supplying the updated coefficients to the adder, or ii. multiplying means for updating the coefficients of the error locator equation, if an $\alpha^i$ value is not a root, using the formulas:

$$\delta_1 = \delta_1 * \alpha$$
$$\delta_2 = \delta_2 * \alpha^2$$
$$\vdots$$
$$\delta_\nu = \delta_\nu * \alpha^\nu$$

said updating means supplying the updated coefficients to the adder;

H. means for incrementing said iteration counter each time said updating means supplies updated coefficients to said adder, said means incrementing said counter until either a predetermined number of roots are found or i equals the block length of the code used to encode the data;

I. means for labeling the code word uncorrectable if all the $\alpha^i$ values corresponding to all possible code word symbol locations have been tried and all the roots have not been found; and J. means for finding the remaining error locations by using a fast-decode method designed to solve an equation of the predetermined degree, and K. means for correcting the errors in the code word using the $\alpha^i$ values corresponding to the error locations.

8. An apparatus for determining the locations of erroneous symbols in a received data code word which is formulated by encoding data symbols in accordance with a BCH code and correcting the errors, said apparatus including:

A. means for receiving a data code word;

B. means for determining if the code word contains errors;

C. means for generating, for a code word that contains errors, an error locator equation relating to the code word, the error locator equation being of the form:

$$1 + \delta_1 * x + \delta_2 * x^2 + \delta_3 * x^3 + \ldots + \delta_{\nu-1} * x^{\nu-1} + \delta_\nu * x^\nu = 0$$

where * represents multiplication over a Galois Field used to encode the data symbols and + represents addition over the Galois Field and the roots of the error locator equation correspond to the locations of erroneous code word symbols;

D. calculating the means for calculating for $\alpha^1$, where $\alpha^i$ corresponds to the location of a data code word symbol, using the coefficients of the error locator equation, the value of $\delta_\nu'$ by iteratively calculating $\delta_j'$ j=1 to v, according to the formulas:

$$\delta_1' = \delta_1 + \alpha^i$$
$$\delta_2' = \delta_1' * \alpha^i + \delta_2$$
$$\vdots$$
$$\delta_\nu' = \delta_{\nu-1}' * \alpha^i + \delta_\nu$$

E. means for storing $\alpha^i$ as an indicator of the location of an erroneous symbol if $\delta_\nu'$ equals ZERO, which indicates that $\alpha^i$ is a root of the error locator equation;

F. updating means, responsive to finding an $\alpha^i$ value which is a root, for updating the error location equation by:
  i. dropping the formula corresponding to the term of the error locator equation with the largest exponent, thereby reducing the degree of the error locator equation, and
  ii. replacing the coefficients with the $\delta_j'$ values calculated by said calculating means; and
  iii. supplying the updated error locator equation to said calculating means;

G. means for supplying to said calculating means a next value of $\alpha^i = \alpha^{i+1}$;

H. said calculating means calculating the value of $\delta_\nu'$ for the $\alpha^i$ value supplied to it until all the roots have been found, or the $\alpha^i$ values corresponding to all possible code word symbol locations have been tried;

I. means for correcting the code word by using the $\alpha^i$ values corresponding to the error locations if all the roots have been found; and J. means for labeling the code word unacceptable if all the $\alpha^i$ values corresponding to all possible code word symbol locations have been tried and all the roots have not been found.

* * * * *

UNITED STATES PATENT AND TRADEMARK OFFICE
CERTIFICATE OF CORRECTION

PATENT NO. : 5,001,715

DATED : March 19, 1991

INVENTOR(S) : Lih-Jyh Weng

It is certified that error appears in the above-identified patent and that said Letters Patent is hereby corrected as shown below:

Column 6, Line 22, delete "$P^1-1$" and insert --$P^q-1$--.

Column 6, Line 37, delete "FG" and insert --GF--.

Claim 1, Line 40, delete "work" and insert --word--.

Claim 2, Line 36, delete "work" and insert --word--.

Claim 3, Line 6-7, delete "all the roots of the error locator equation are found" and insert after the word "either" --a predetermined number of roots are found and the reduced error locator equation has a predetermined degree--.

Claim 3, Line 9, delete "and".

Claim 5, Line 26, insert before the word "determining" --means for--.

Claim 5, Line 27, delete "if the code word contains errors, generating" and insert before the word "an" --means for generating, for a code word that contains errors,--.

Claim 5, Line 8, delete "αhu i" and insert after the word "the" --$\alpha^i$--.

UNITED STATES PATENT AND TRADEMARK OFFICE
CERTIFICATE OF CORRECTION

PATENT NO. : 5,001,715

DATED : March 19, 1991

INVENTOR(S) : Lih-Jyh Weng

It is certified that error appears in the above-identified patent and that said Letters Patent is hereby corrected as shown below:

Claim 7, Line 21, delete "all the" and insert after the word "and" --the predetermined number of--.

Claim 8, Line 42, delete "unacceptable" and insert after the word "word" --uncorrectable--.

Signed and Sealed this

Sixteenth Day of March, 1993

Attest:

STEPHEN G. KUNIN

*Attesting Officer*   *Acting Commissioner of Patents and Trademarks*